(12) United States Patent
Dutartre et al.

(10) Patent No.: US 9,929,039 B2
(45) Date of Patent: Mar. 27, 2018

(54) METHOD FOR MANUFACTURE OF A SEMICONDUCTOR WAFER SUITABLE FOR THE MANUFACTURE OF AN SOI SUBSTRATE, AND SOI SUBSTRATE WAFER THUS OBTAINED

(71) Applicant: STMicroelectronics SA, Montrouge (FR)

(72) Inventors: Didier Dutartre, Meylan (FR); Herve Jaouen, Saint Nazaire les Eymes (FR)

(73) Assignee: STMicroelectronics SA, Montrouge (FR)

(*) Notice: Subject to any disclaimer, the term of this patent is extended or adjusted under 35 U.S.C. 154(b) by 0 days.

(21) Appl. No.: 15/129,328

(22) PCT Filed: Mar. 27, 2015

(86) PCT No.: PCT/EP2015/056719
§ 371 (c)(1),
(2) Date: Sep. 26, 2016

(87) PCT Pub. No.: WO2015/150257
PCT Pub. Date: Oct. 8, 2015

(65) Prior Publication Data
US 2017/0103913 A1    Apr. 13, 2017

(30) Foreign Application Priority Data
Mar. 31, 2014  (FR) ...................................... 14 52845

(51) Int. Cl.
*H01L 29/04*   (2006.01)
*H01L 21/763*  (2006.01)
*H01L 21/762*  (2006.01)
*H01L 21/02*   (2006.01)

(52) U.S. Cl.
CPC ...... *H01L 21/7624* (2013.01); *H01L 21/0245* (2013.01); *H01L 21/02488* (2013.01); *H01L 21/02502* (2013.01); *H01L 21/02513* (2013.01); *H01L 21/02532* (2013.01); *H01L 21/02595* (2013.01)

(58) Field of Classification Search
None
See application file for complete search history.

(56) References Cited

U.S. PATENT DOCUMENTS

| 7,868,419 B1 | 1/2011 | Kerr et al. |
| 2012/0202327 A1 | 8/2012 | Lehnert et al. |
| 2013/0084689 A1 | 4/2013 | Arriagada et al. |

(Continued)

OTHER PUBLICATIONS

International Search Report and Written Opinion for PCT/EP2015/056719 dated Jun. 1, 2015 (10 pages).

*Primary Examiner* — Seahvosh Nikmanesh
*Assistant Examiner* — Xiaoming Liu
(74) *Attorney, Agent, or Firm* — Gardere Wynne Sewell LLP

(57) ABSTRACT

A semiconductor wafer suitable for fabricating an SOI substrate is provided by: producing a first layer of polycrystalline semiconductor on a top side of a semiconductor carrier; then forming an interface zone on a top side of the first layer, wherein the interface zone has a structure different from a crystal structure of the first layer; and then producing a second layer of polycrystalline semiconductor on the interface zone.

18 Claims, 3 Drawing Sheets

(56) References Cited

U.S. PATENT DOCUMENTS

2014/0084290 A1 3/2014 Allibert et al.
2015/0115480 A1* 4/2015 Peidous ............ H01L 21/76251
  257/798

* cited by examiner

METHOD FOR MANUFACTURE OF A SEMICONDUCTOR WAFER SUITABLE FOR THE MANUFACTURE OF AN SOI SUBSTRATE, AND SOI SUBSTRATE WAFER THUS OBTAINED

CROSS-REFERENCE TO RELATED APPLICATIONS

This application is a 371 filing from PCT/EP2015/056719 filed Mar. 27, 2015, which claims priority to French Application for Patent No. 1452845 filed Mar. 31, 2014, the disclosures of which are hereby incorporated by reference.

TECHNICAL FIELD

The invention relates to the field of electronics and more precisely to the field of semiconductor substrates allowing electronic circuits to be fabricated, especially electronic circuits dedicated to radio-frequency applications.

In particular, methods of implementation and embodiments of the invention relate to a process for producing a silicon-on-insulator (SOI) structure, and to such a structure.

BACKGROUND

An SOI substrate conventionally comprises a semiconductor film (or top semiconductor layer) located on top of a buried insulating layer (generally of silicon oxide), which is commonly designated by the acronym BOX (for Buried OXide), itself located on top of a carrier substrate, a bulk substrate for example.

High-performance radio-frequency (RF) integrated circuits are generally fabricated on what are referred to as high-resistivity (HR) p-doped semiconductor substrates, i.e. substrates with a resistivity typically higher than 1 kohm·cm, so as to limit losses in the substrate and crosstalk between neighboring components due to conduction.

Furthermore, it is common to use silicon-on-insulator (SOI) HR substrates. The passive or active components formed in and on the top semiconductor layer are then insulated from the bulk substrate by the buried oxide layer.

However, it has been observed that although using such substrates decreases losses related to the substrate, it does not completely prevent them. Specifically, stationary positive electric charges are inevitably present in the BOX due to the fabrication process of this oxide layer. Said charges are responsible for the accumulation in the substrate, in the vicinity of the BOX, of mobile electric charges (electrons) that are able to form a conductive channel. Thus, even if HR substrates are used, parasitic surface conduction in the substrate leads to Joule losses as a result of eddy currents.

Furthermore, the insulated silicon/BOX/substrate stack behaves as a metal oxide semiconductor (MOS) capacitor. To a first approximation, the thickness of the inversion layer associated with this MOS capacitor is considered to vary inversely with the square root of the dopant concentration of the substrate. Therefore, it will be understood that this thickness is correspondingly larger when the substrate is an HR substrate, i.e. weakly doped. The capacitance of this capacitor has the property of being modulated by the electric potential applied to the components formed in or on the insulated silicon film, opposite and above the BOX. This modulated parasitic capacitance is responsible for harmonic distortions and crosstalk affecting the RF components of integrated circuits in a way that is detrimental to the performance of these components. Such distortion may in particular be quantified by the third-order intercept point (abbreviated TOIP or IP3) method.

In order to mitigate this effect, it is known to use more complex carrier substrate structures, incorporating a specific region separating the single-crystal portion of the carrier substrate and the BOX so as to create, near the BOX, a high density of surface states capable of trapping free carriers. This trapping of free carriers by surface states greatly decreases the effect of parasitic surface conduction. Furthermore it leads to pinning of the Fermi level in the semiconductors at the substrate/BOX interface, thereby making the capacitance of the parasitic MOS capacitor largely independent of the electric potential applied to the components formed opposite, above the BOX, and thus limiting harmonic distortions. Such substrates are qualified "trap-rich".

The document "SOT technology: An Opportunity for RF Designers," Journal of Telecommunications and Information Technology, 04/2009 (incorporated by reference) describes a particularly effective method for forming a trap-rich layer under the BOX of an SOI substrate, consisting in forming a carrier substrate comprising a polysilicon layer inserted between the single-crystal portion of the carrier substrate and the BOX. Specifically, discontinuities in the crystal structure at the grain boundaries of the polysilicon act as charge traps. Such a layer may be formed by depositing on the single-crystal substrate, before the BOX has been formed, a polysilicon or amorphous silicon layer, by way of low-pressure chemical vapor deposition (LPCVD) or plasma-enhanced chemical vapor deposition (PECVD), this deposition operation being followed by a stabilization and/or recrystallization anneal. To ensure that a polycrystalline layer is indeed obtained rather than simple epitaxy from the single-crystal substrate, it is necessary to form on the latter, before the silicon is deposited, an interface layer that blocks epitaxial growth. A silicon oxide layer of less than 1 nm in thickness, obtained by chemical or thermal oxidation, is sufficient for this purpose.

In order to increase the density of traps, it is desirable to increase the density of grain boundaries at the polysilicon/BOX interface, i.e. to decrease the average width of the grains at this interface. Unfortunately, the inventors have observed that the growth of the polysilicon obtained by CVD is of the 'divergent' pseudo-columnar type, i.e. the grains have substantially the shape of inverted cones that widen between the bottom of the layer and its top. The average width of the grains is therefore maximal at the top of the polysilicon layer, i.e. at the polysilicon/BOX interface, and therefore the density of traps per unit area at this interface is not optimal.

However, in order to ensure the single-crystal portion of the carrier substrate is separated from the BOX and the components produced on the thin layer located on top of the BOX by a large enough distance, the polysilicon layer must be at least 1000 nm to 5000 nm in thickness, and, as a result, the average width of the polysilicon grains at the polysilicon/BOX interface is then about 200 nm to 1000 nm. For RF components in 90 nm or 65 nm technology or lower, this therefore means that the average width of the polysilicon grains at the interface with the BOX is larger than the lateral dimension of the elementary transistors above the BOX. Thus, depending on the location of the components above the BOX, transistors for example, said components will randomly either be plumb with a single grain or a plurality of grains. This leads to a dispersion in the electrical parameters of the transistors since the density of traps under a transistor depends on its position with respect to the grains.

The inventors have observed that forming the polysilicon layer by controlled recrystallization of an amorphous silicon layer does not substantially decrease the average size of the grains of polysilicon at the polysilicon/BOX interface. Specifically, a minimum thermal budget is required to sufficiently stabilize a multilayer substrate and to make it thermomechanically stable enough to be able to used as a starting substrate for the fabrication of integrated circuits. This thermal budget leads to a polysilicon layer the grain size of which is equal to or larger than that obtained by depositing a polysilicon layer directly on the bulk substrate.

There is therefore a need for a method for fabricating an SOI substrate that remedies all or some of the above drawbacks.

SUMMARY

According to one method of implementation and embodiment, a method is provided for producing an SOI substrate especially allowing the trapping of electrical charges at the interface between the electrically insulating layer (BOX) and the carrier substrate of the SOI substrate to be improved.

According to one aspect, a process is provided for producing a silicon-on-insulator substrate including producing a carrier substrate and producing a semiconductor film located on top of a buried insulating layer itself located on top of the carrier substrate.

According to this aspect, the production of the carrier substrate comprises producing, on one side of a semiconductor carrier, a stack located between said semiconductor carrier and said buried insulating layer and including at least one initial structure.

The production of said initial structure includes the following successive steps:
producing, on said side of said semiconductor carrier, a first layer of polycrystalline semiconductor;
forming an interface zone on the top side of said first layer, said interface zone having a structure different from the crystal structure of said first layer; and
producing, on said interface zone, a second layer of polycrystalline semiconductor.

These stacked interface zones and layers are therefore advantageously formed in sucession starting from and using one and the same carrier, namely starting from and using said same semiconductor carrier.

According to one method of implementation, the formation of the interface zone comprises exposing the top side of the first layer to an oxidizing environment in order to oxidize said top side.

As a variant, the formation of the interface zone comprises amorphizing the top side of said first layer.

The production of said stack may furthermore comprise producing at least one additional structure on said second layer, this including producing a new interface zone surmounted by a new layer of polycrystalline semiconductor, so as to form a stack of a plurality of layers of polycrystalline semiconductor, the layers of polycrystalline semiconductor respectively being separated by interface zones having a structure different from the crystal structure of said layers of polycrystalline semiconductor.

According to one method of implementation, the last layer of polycrystalline semiconductor of said stack has a thickness smaller than 20% of the total thickness of the layers of polycrystalline semiconductor of said stack.

According to another aspect, a silicon-on-insulator substrate is provided comprising a semiconductor film located on top of a buried insulating layer itself located on top of a carrier substrate.

According to this aspect, the carrier substrate includes a semiconductor carrier and a stack located between one side of the semiconductor carrier and said buried insulating layer.

Said stack includes at least one initial structure including a first layer of polycrystalline semiconductor making contact with said side of the semiconductor carrier and a second layer of polycrystalline semiconductor, said second layer being separated from the first layer by an interface zone having a structure different from the crystal structure of said first layer.

The thickness of the second layer may be comprised between 100 nm and 300 nm.

According to one embodiment, the substrate may furthermore comprise at least one additional structure on said second layer, including a new interface zone surmounted by a new layer of polycrystalline semiconductor, so as to form a stack of a plurality of layers of polycrystalline semiconductor, said layers respectively being separated by interface zones having a structure different from the crystal structure of said layers of polycrystalline material.

The last layer of polycrystalline semiconductor of the stack may have a thickness smaller than 20% of the total thickness of the layers of polycrystalline semiconductor of the stack.

BRIEF DESCRIPTION OF THE DRAWINGS

Certain aspects of the invention will be better understood on reading the following description, which is given merely by way of example, and with reference to the appended figures, in which.

DETAILED DESCRIPTION

Of course, to make the figures easier to understand, the various elements shown, and in particular the layers making up the semiconductor wafers, have been drawn schematically and the proportions of these various elements may differ from their actual proportions.

The description below in particular relates to an example of a process for producing a semiconductor wafer forming a carrier substrate of an SOI substrate, and certain variant embodiments, and describes certain effects and advantages resulting from the structure of such a wafer.

In order not to confuse the reader, only steps that are important to the production of such a wafer will be detailed, it being understood that a person skilled in the art will implement conventional processes relating to preparation, cleaning and finishing operations inter alia, without it being necessary to describe them in detail here.

Figure 1:
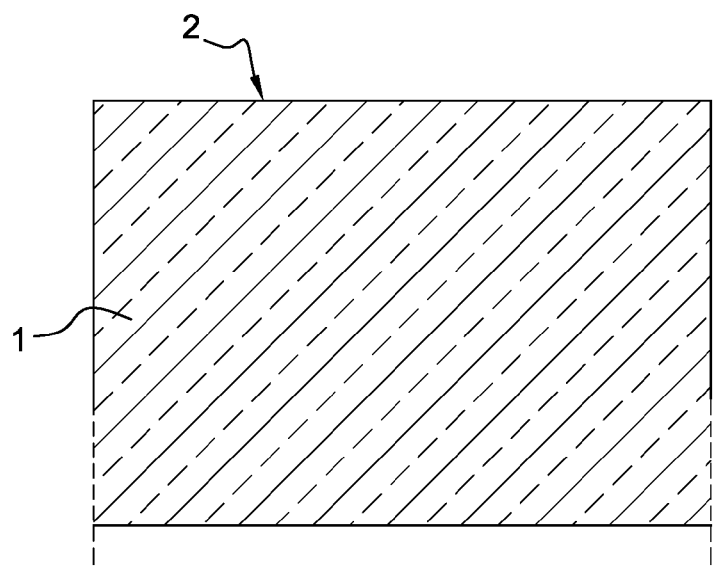
FIGS. 1 to 4 and 6 are simplified schematics of a partial side view of a semiconductor wafer forming a carrier substrate of an SOI substrate during its fabrication.

The process starts with the preparation of a semiconductor base carrier, also referred to as a wafer, such as illustrated in FIG. 1. This carrier 1 may be produced from any semiconductor, and in particular is based on silicon. Thus, in the rest of the description, the base semiconductor will be described as being silicon, it being understood that it could be replaced by any other known semiconductor, and in particular germanium or gallium arsenide.

The embodiment described here is particularly advantageous for high-resistivity semiconductor carriers, i.e. carriers with relatively low doping, that typically have a resistivity higher than 1 kohm·cm. This type of substrate is particularly appreciated for the production of radio-frequency components.

Figure 2:
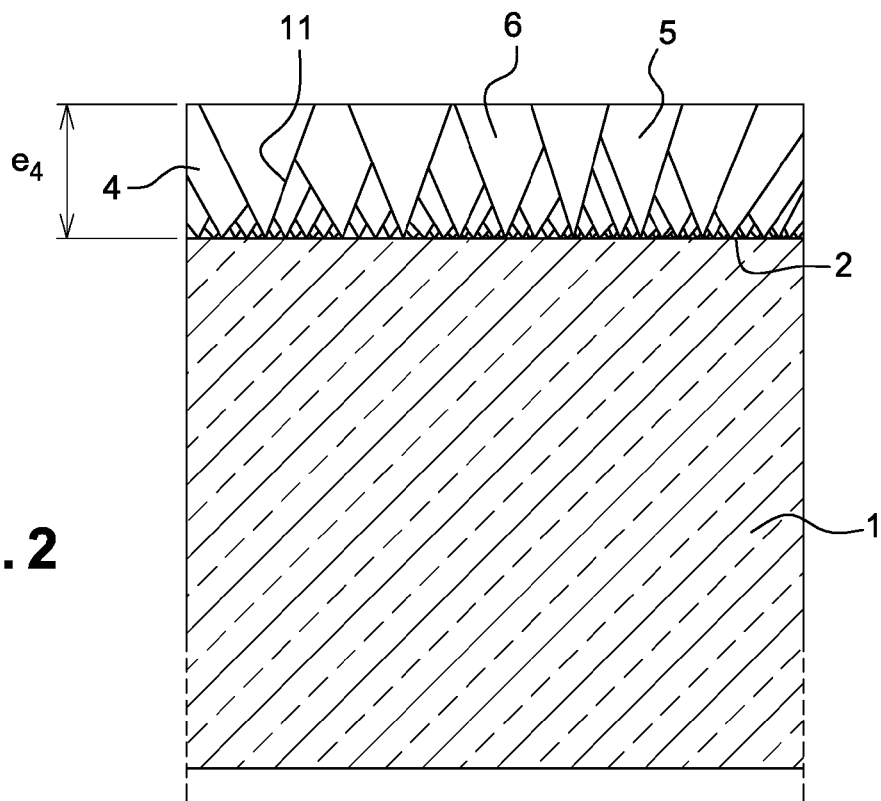

Thus, in a first step, the top side 2 of the substrate 1 is prepared in order to allow a polysilicon layer to be deposited. Next, as illustrated in FIG. 2, a first polysilicon layer 4 is formed on the top side 2 of the semiconductor carrier 1. More precisely, this first layer 4 is deposited on the top side 2 of the carrier 1 by a chemical vapor deposition technique, so as to form a layer 4 the thickness $e_4$ of which is typically comprised between 500 nanometers and 5000 nanometers and preferably between 1000 nanometers and 2000 nanometers (the thickness $e_4$ is defined in a direction normal to the interface between two layers). Optionally, after it has been deposited, the first layer 4 may be subjected to a heat treatment appropriate for its thickness and its nature, so as to stabilize its structure by crystallizing it. On account of the surface finish of the substrate layer 1 before this deposition, the silicon atoms organize into local crystal arrangements, providing a divergent pseudo-columnar structure, with grains 5, 6 of a substantially pyramidal shape that widens toward the top, as schematically illustrated in FIG. 2. Heat treatment operations may modify the grains and the grouping of certain grains into grains of larger size.

Of course, other deposition techniques may be employed to form this first layer, for example low-pressure chemical vapor deposition (LPCVD), or more generally any type of known deposition technique allowing polysilicon layers to be produced.

Figure 3:
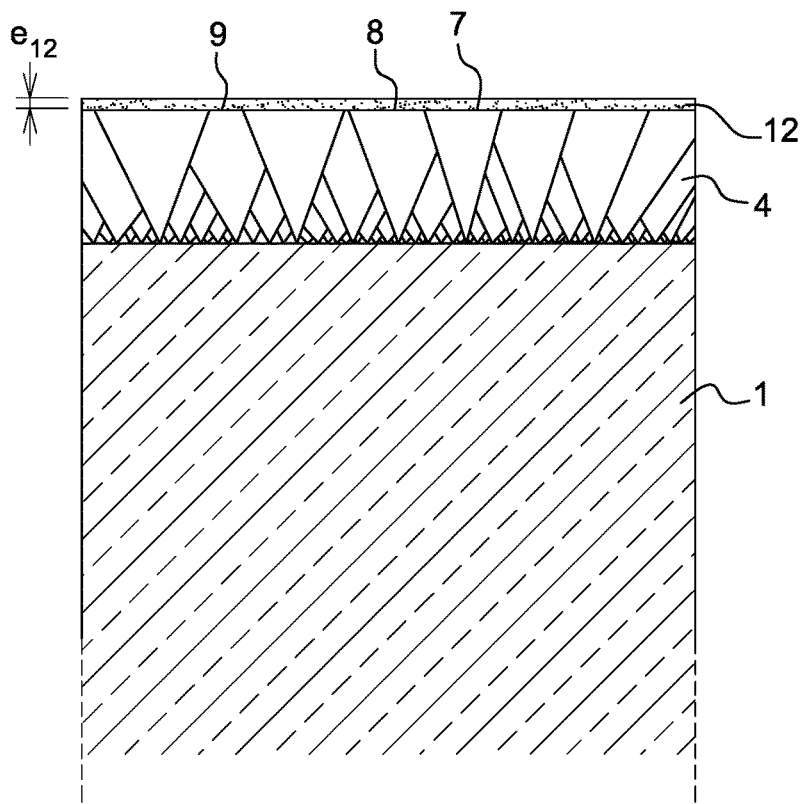

In a subsequent step, illustrated in FIG. 3, a surface treatment may be carried out to create an interface zone 12 on which a new polysilicon layer will be deposited.

Specifically, the top side 7 of the first polysilicon layer 4 is divided into various regions 8, 9 each belonging to a separate grain, each region having a regular crystal structure. Silicon deposited directly on this side 7 would grow epitaxially and thus continue the growth of the grains of the underlying layer. However, one of the stated objectives is to increase the density of the boundaries 11 between grains, and therefore to preserve small grains. To prevent epitaxial growth, the second step comprises forming an interface zone on the surface 7 of the first polysilicon layer 4, thereby allowing a new polysilicon layer to be grown without epitaxial regrowth and therefore with a maximum of separate grains.

To do this, various techniques may be employed. It is thus possible to expose the top side 7 of the first layer 4 of polysilicon to an environment comprising oxidizing species. This oxidation may be obtained simply by exposing the wafer, still sufficiently hot following the deposition of the first polysilicon layer 4, to the ambient atmosphere, or to a controlled atmosphere including a percentage of oxygen. Natural oxidation effects create, on the surface 7 of the polysilicon layer 4, a layer 12 of very small thickness $e_{12}$ of about the order of a nanometer, which layer has a structure different from the crystal structure of the polysilicon grains (the thickness $e_{12}$ of the layer shown in FIG. 3 is of course exaggerated in order to make it possible to see). This oxidation may also be achieved via a controlled thermal oxidation such as a rapid thermal oxidation (RTO) i.e. oxidation the rate of which is increased by heating the wafer, typically to between 600 and 900° C., in the presence of an oxidizing atmosphere.

It is also possible to obtain this oxidation by carrying out a chemical oxidizing treatment in a conventional way.

Among other possible ways of producing the interface zone 12, mention may be made of operations for implanting non-dopant ionic species, such as argon, germanium or any other suitable heavy ion. Such ion bombardment allows the surface 7 of the polycrystalline layer 4 to be at least partially amorphized, i.e. the crystal arrangement on the surface of the grains to be broken, thereby making it possible to avoid epitaxial growth when a new polysilicon layer is deposited.

Figure 4:
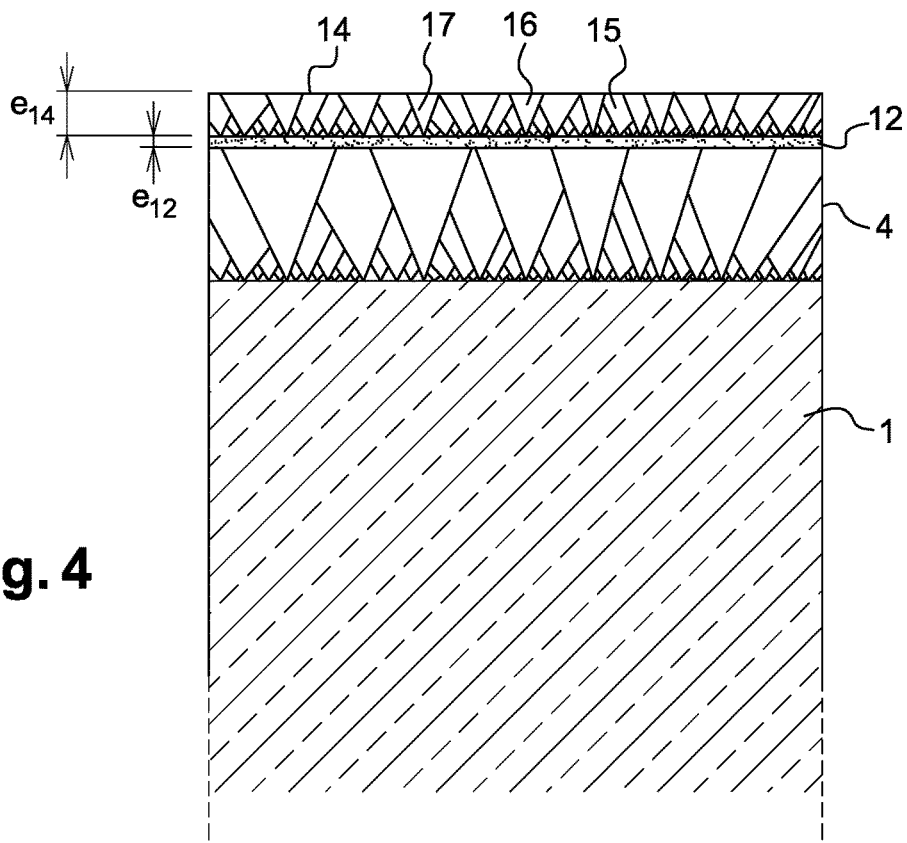

In a subsequent step, illustrated in FIG. 4, a second layer 14 of silicon is deposited on the interface zone 12. This second layer 14 may advantageously be produced in an identical way to that described for the layer 4, thus allowing a second layer 14 of a thickness $e_{14}$ to be produced, $e_{14}$ typically being about a few tens of nanometers to a few hundred nanometers and preferably between about 100 and 300 nm.

Because the layer 14 is grown on an interface zone that is amorphous, or unstructured as explained above, the crystals of the second polysilicon layer do not form epitaxially on the crystals of the first layer 4. In other words, the top side of the first layer 4 is unstructured and hence the crystals of the first layer 4 are not extended and enlarged in the second layer. Thus, polysilicon grains 15, 16 that are small in size are observed to appear in the region closest to the interface zone 12. This results in an overall increase in the concentration per unit volume of grain boundaries, i.e. of borders 17 between the various polysilicon grains, in the entire region located above the single-crystal substrate layer 1 (semiconductor carrier). This high concentration of grain boundaries per unit volume allows the density of charge traps to be substantially increased in the region that will be located under the BOX. It will be noted here that the interface 12 has a function similar to the aforementioned interface 2.

Figure 6:
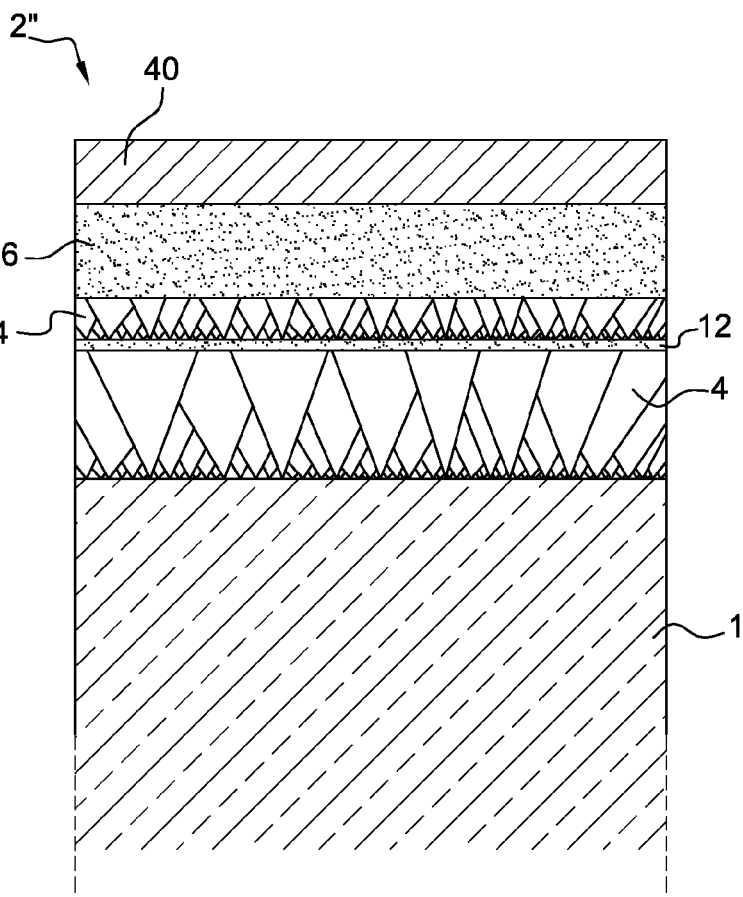

At this stage, as illustrated in FIG. 4, a carrier substrate of an SOI substrate has been formed, said substrate including a semiconductor carrier 1 and a stack located on the side 2 of the semiconductor carrier 1 and intended, as will be seen with reference to FIG. 6, to be located between the side 2 of the carrier and the buried insulating layer (BOX) of the SOI substrate.

Said stack here includes an initial structure including the first layer 4 of polycrystalline semiconductor making contact with said side 2 of the semiconductor carrier and the second layer 14 of polycrystalline semiconductor, said second layer 14 being separated from the first layer 4 by the interface zone 12 having a different structure from the crystal structure of said first layer.

Figure 5:
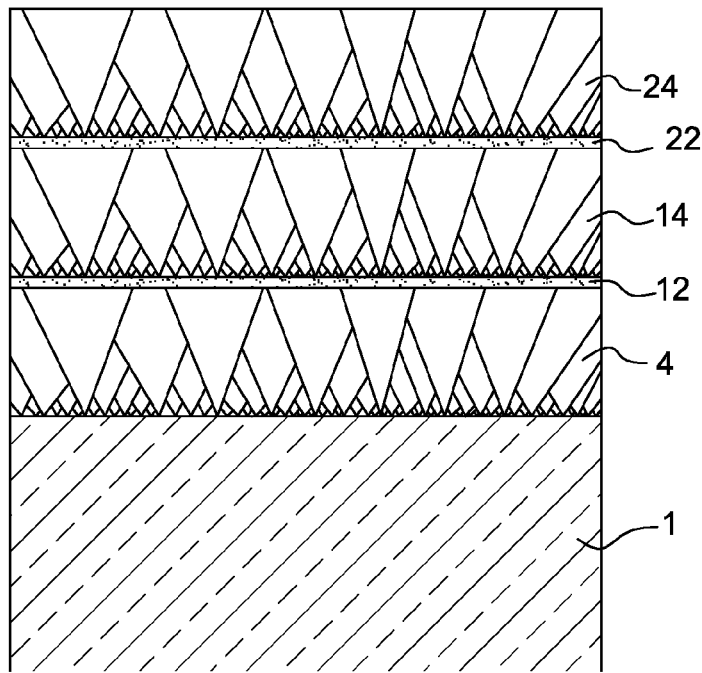
FIG. 5 is a simplified schematic of a side view of a variant embodiment of such a semiconductor wafer.

As a variant, it is possible, as illustrated in FIG. 5, to repeat the operation of depositing an additional polysilicon layer 24 on a new interface zone 22 that is functionally analogous to the interface zone 12.

As may be seen in this FIG. 5, the additional structure including the new interface zone 22 surmounted by the new layer 24 of polycrystalline semiconductor leads to the formation of a stack of a plurality of layers 4, 14, 24 of polycrystalline semiconductor respectively separated by interface zones 12, 22 having a different structure from the crystal structure of said layers 4, 14, 24 of polycrystalline semiconductor.

Of course, the number of superposed polysilicon layers may be multiplied if it is desired to further increase the concentration of grain boundaries per unit volume. It will be noted that the smaller the thickness of each of these polysilicon zones, the greater the density of grain boundaries in the layer, on account of the inverted pyramidal growth of the polysilicon.

It is also conceivable to select the individual thickness of each of the polysilicon layers to ensure a preset variation of the concentration of grain boundaries per unit volume as a function of distance from the BOX. In one preferred embodiment, the thickness of the last polysilicon layer forming the stack is smaller than 20% of the total thickness of said stack of polysilicon layers.

Next, and as illustrated in FIG. 6, the wafer (carrier substrate) 1, 4, 12, 14 thus obtained may be finished by known techniques with a view to producing an SOI substrate 2" comprising the semiconductor film 40 located on top of the buried insulated layer (BOX) 36. Thus, in particular, as the roughness of the thick polysilicon deposits may be incompatible with the direct bonding process employed to bond the insulated silicon film, the stack will advantageously be planarized, for example by chemical-mechanical polishing CMP. Mention may also be made, by way of example, of the possibility of producing an oxide layer 36 on the last characteristic polysilicon layer 14, which oxide layer will then be bonded by direct bonding to the single-crystal film 40 that will form the thin layer (semiconductor film) of the SOI substrate. It is also possible for the insulating layer 36 (BOX) of the SOI substrate to be produced on a separate wafer, then bonded by direct bonding with the thin single-crystal layer to an analogous oxide layer produced on the last polysilicon layer. Other techniques for completing the SOI substrate may be applied to the base structure (carrier substrate) 1, 4, 12, 14 described above, comprising a single-crystal substrate on which at least two polysilicon layers are stacked.

It will be apparent from the above that an SOI substrate produced as described above allows the effect of parasitic surface conduction in the single-crystal substrate, in the zone located under the BOX, to be decreased, including when the substrate is a high-resistivity substrate. Specifically, the high concentration of grain boundaries allows the effective resistivity of the semiconductor to be increased. Furthermore, the high concentration of grain boundaries also allows the potential modulation of the capacitance of the parasitic capacitor created by the BOX and the underlying substrate, with respect to the bias applied to the electronic components formed on the SOI substrate, to be limited. In a complementary manner, because of the decrease in the size of the grains in the region located under the BOX, the number of grains present under the various components produced in the thin layer (semiconductor film) of the SOI substrate is increased, and the risk of dispersion from one component to another is limited.

The invention claimed is:

1. Process for producing a silicon-on-insulator substrate, including:
    producing a carrier substrate, and
    producing a semiconductor film located on top of a buried insulating layer itself located on top of the carrier substrate,
    wherein producing the carrier substrate comprises producing, on one side of a semiconductor carrier, a stack located between said semiconductor carrier and said buried insulating layer and including at least one initial structure,
    wherein producing said at least one initial structure of the stack comprises the following successive steps:
        producing, on said one side of said semiconductor carrier, a first layer of polycrystalline semiconductor having a first thickness;
        forming an interface zone on a top side of said first layer, said interface zone having a structure different from a crystal structure of said first layer; and
        producing, on said interface zone, a second layer of polycrystalline semiconductor having a second thickness, wherein the second thickness is less than the first thickness.

2. Process according to claim 1, wherein forming the interface zone comprises exposing the top side of the first layer to an oxidizing environment in order to oxidize said top side of the first layer.

3. Process according to claim 1, wherein forming the interface zone comprises amorphizing the top side of said first layer.

4. Process according to claim 1, wherein producing said stack further comprises producing at least one additional structure on said second layer by producing a new interface zone surmounted by a new layer of polycrystalline semiconductor, wherein layers of the stack of the plurality of layers of polycrystalline semiconductor are respectively separated by interface zones having a structure different from the crystal structure of said layers of polycrystalline semiconductor.

5. Process according to claim 4, wherein a last layer of plurality of layer of polycrystalline semiconductor of said stack has a thickness smaller than 20% of a total thickness of preceding layers of polycrystalline semiconductor of said stack.

6. A process, comprising:
    producing a first layer of polycrystalline semiconductor above a semiconductor carrier, said first layer having a divergent pseudo-columnar crystal arrangement with a grouping of grains having a first size; then
    forming an interface zone on a top side of said first layer, said interface zone having a structure different from a crystal structure of said first layer; then
    producing a second layer of polycrystalline semiconductor on said interface zone, said second layer having a divergent pseudo-columnar crystal arrangement with a grouping of grains having a second size smaller than the first size.

7. The process of claim 6, wherein the first layer has a thickness between 500 nm and 5000 nm and the second layer has a thickness between 100 nm and 300 nm.

8. The process of claim 6, wherein forming the interface zone comprises oxidizing the top size of said first layer.

9. The process of claim 6, wherein forming the interface zone comprises amorphizing the top size of said first layer.

10. The process of claim 6, further comprising:
    forming a buried oxide layer above a top surface of the second layer of polycrystalline semiconductor; and
    forming a semiconductor film on a top surface of the buried oxide layer to as to produce a semiconductor on insulator (SOI) substrate.

11. The process of claim 6, wherein the first layer has a first thickness and the second layer has a second thickness that is less than the first thickness.

12. A process for producing a silicon-on-insulator substrate, including:
    producing a carrier substrate, and
    producing a semiconductor film located on top of a buried insulating layer itself located on top of the carrier substrate, wherein producing the carrier substrate comprises producing, on one side of a semiconductor carrier, a stack located between said semiconductor carrier and said buried insulating layer, wherein producing said stack comprises the following successive steps:
- producing a first layer of polycrystalline semiconductor in contact with a top side of said semiconductor carrier, said first layer having a first thickness and a corresponding first concentration of grain boundaries;
- forming an interface zone in contact with a top side of said first layer, said interface zone having a structure different from a crystal structure of said first layer; and
- producing a second layer of polycrystalline semiconductor in contact with a top side of the interface zone, said second layer having a second thickness and a corresponding second concentration of grain boundaries, wherein the second thickness is less than the first thickness and the second concentration is greater than the first concentration.

13. The process according to claim 12, wherein the second thickness is no more than 20% of the first thickness.

14. The process according to claim 12, wherein forming the interface zone comprises exposing the top side of the first layer to an oxidizing environment in order to form an interface zone comprising a semiconductor oxide layer.

15. The process according to claim 12, wherein forming the interface zone comprises amorphizing the top side of said first layer in order to form an interface zone comprising an amorphous semiconductor layer.

16. The process according to claim 12, wherein producing said stack further comprises producing a third layer of polycrystalline semiconductor above the second layer and separated from the second layer by a further interface zone.

17. The process according to claim 16, wherein the third layer has a third thickness and a corresponding third concentration of grain boundaries, wherein the third thickness is less than both the first and second thicknesses and the third concentration is greater than both the first and second concentrations.

18. The process according to claim 17, wherein the third thickness of the third layer is no more than 20% of a total thickness of preceding layers of said stack.

* * * * *